(12) United States Patent
Kuenemund (10) Patent No.: US 7,161,869 B2
(45) Date of Patent: Jan. 9, 2007

(54) TRANSMISSION DEVICE

(75) Inventor: Thomas Kuenemund, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/022,278

(22) Filed: Dec. 23, 2004

(65) Prior Publication Data

US 2005/0146911 A1 Jul. 7, 2005

(30) Foreign Application Priority Data

Jan. 7, 2004 (DE) .................... 10 2004 001 235

(51) Int. Cl.
*G11C 8/00* (2006.01)
(52) U.S. Cl. .................. 365/230.05; 365/190
(58) Field of Classification Search ............ 365/230.05
See application file for complete search history.

(56) References Cited

U.S. PATENT DOCUMENTS 6,427,033 B1 * 7/2002 Hait ............................ 385/11
6,654,884 B1 11/2003 Jaffe et al.
6,816,397 B1 * 11/2004 Golz et al. .................... 365/51
2005/0134360 A1 * 6/2005 Aipperspach et al. ....... 327/513

FOREIGN PATENT DOCUMENTS

DE 199 36 918 A1 4/2000
DE 102 14 118 A1 10/2003

OTHER PUBLICATIONS

Saputra, H. et al.; "Masking the Energy Behavior of Encryption Algorithms"; IEE Proc.-Computers and Digital Techniques, vol. 150, No. 5, Sep. 2003.
Moore, S. et al.; "Improving Smart Card Security Using Self-Timed Circuits"; Proceedings of the Eighth International Symposium on Asynchronous Circuits and Systems (ASYNC 2002).

* cited by examiner

*Primary Examiner*—Thong Q. Le
(74) *Attorney, Agent, or Firm*—Dickstein, Shapiro, LLP.

(57) ABSTRACT

A transmission device has a device for generating a signal pair and a device for generating a recovered data signal. The device for generating the signal pair is formed to output a first data signal either as first signal or as first complementary signal in response to a value of a switching signal. The device for generating a recovered data signal is, in turn, formed to output the first signal as a first recovered data signal or the first complementary signal as the first recovered data signal in response to a value of the switching signal.

13 Claims, 7 Drawing Sheets

PRIOR ART
FIG 6

TRANSMISSION DEVICE

CROSS-REFERENCE TO RELATED APPLICATION

This application claims priority from German Patent Application No. 10 2004 001 235.0, which was filed on Jan. 7, 2004, and is incorporated herein by reference in its entirety.

BACKGROUND OF THE INVENTION

1. Field of the Invention

The present invention relates to a device for generating a pair of signals, a device for generating a recovered data signal, a device for carrying out a data path operation, and a device for storing a pair of signals, and particularly to a device for generating a pair of signals and a device for generating a recovered data signal allowing a secure transmission of a data signal via a data path.

2. Description of the Related Art

Integrated circuits (IC) carrying out security-relevant applications must be protected against external attacks. The differential power analysis (DPA) is a major method for attacking ICs for security applications and for assessing the susceptibility of ICs to specific attacks on confidential information like passwords or cryptographic keys. In DPA, a measured current profile of the IC and/or its charge integral calculated over one or more clock cycles is evaluated with statistical methods for a given program and/or a given algorithm. From a correlation of a systematic data variation and the associated charge integral, conclusions can be drawn with respect to the information to be protected for a variety of program executions.

Frequently microprocessors and microcontrollers are employed for security-relevant applications. In the core of a processing unit of modern microprocessors or microcontrollers, the so-called CPU (central processing unit), there is the data path. The data path constitutes an interconnection of all functional units for processing of data within the CPU. The interconnection takes place via line groups, so-called data busses, and includes characteristic functional units such as multiplexer, arithmetic logical unit (ALU), shifter and storage circuits referred to as register files.

On the one hand, a register file discussed in the following serves for storing and/or latching addresses and data required for the task just being processed by the CPU. Thus the register file may be understood as a scratchpad. Furthermore, the register file serves for a quick, random and simultaneous read access to generally at least two ALU operands, and a quick, random write access simultaneous to read accesses. For this, the register file comprises so-called write back ports serving for writing back results and/or intermediate results of ALU computing operations. Furthermore, the register file serves for loading and for transmitting addresses and data into and from the register file. For this, the register file comprises write/read ports serving for the communication with system parts external to the CPU data path.

In order to satisfy all these requirements with minimal area and energy consumption, register files are often implemented as multi-port memories, so-called multi-port RAMs (RAM=random access memory). A RAM consists of registers interconnected via their bit line groups, wherein a functional unit register is defined here as a set of homogeneous so-called one-bit register cells with the four properties of the register file listed above. The number of bits which may be stored in a register generally corresponds to a bit width of the data path. The number of ports corresponds to the maximum number of different accesses to be allowed simultaneously to different registers.

Figure 6:
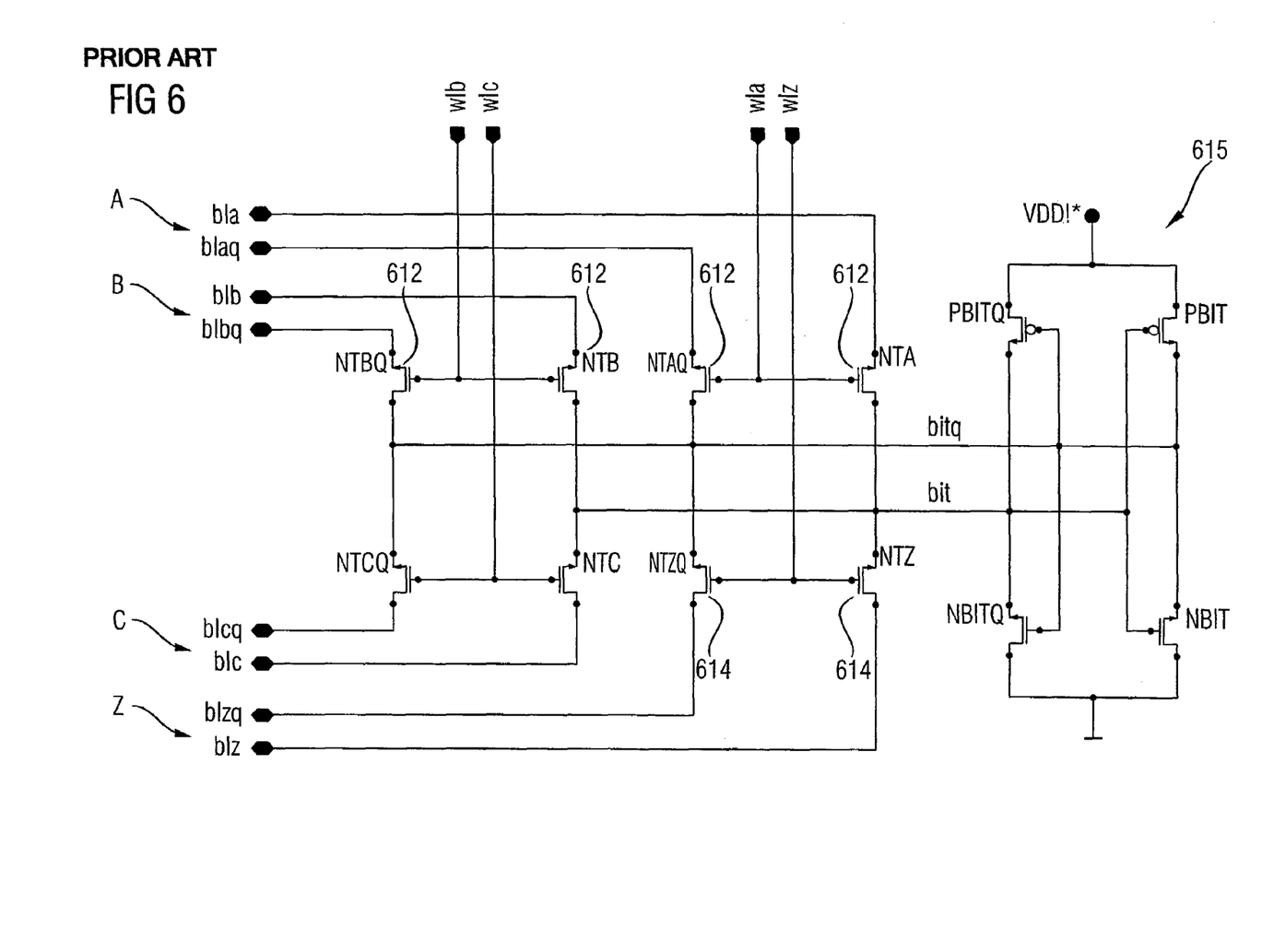
FIG. 6 is a circuit diagram of a memory cell according to prior art.

FIG. 6 shows a prior art one-bit register cell with the minimum number of four ports A, B, C, Z in the above sense. Port A comprises a bit line pair bla, blaq, and a word line wla. Port B comprises a bit line pair blb, blaq, and a word line wlb. Port Z comprises a bit line pair blzq, blz, and a word line wlz, and port C comprises a bit line pair blcq, blc, and a word line wlc. Normally, operands are read out via the ports A and B. Via port Z, a computing result is written back, and via port C, memory contents external to the data path are loaded and/or transmitted thereto.

The ports A and B are thus described as pure read ports. In case of a low potential level of the word lines wla and wlb, the n-channel transfer transistors 612 block. First, the nodes corresponding to the bit line pairs bla, blaq, and blb, blbq, respectively, are precharged to a high potential level Vdd and are then disconnected from the precharging device (not shown) provided for this per bit line pair in the periphery of the register file. The bit line pairs bla, blaq and blb, blbq, respectively, are then still at a high potential level Vdd, but they are no longer held there actively, i.e. by conductive connection with the supply voltage source, but only capacitively. This state referred to as floating state will be referred to as (H, H). Shortly afterwards, the bit line pairs bla, blaq and blb, blbq, respectively, are conductively connected to the nodes bit and bitq, respectively, within the cell 615 by word lines wla and/or wlb raised to a high potential level. Since one of the two nodes bit, bitq is at a low potential, the bit line bla, blaq, blb, blbq connected conductively therewith via the now opened transfer transistor 612 is also discharged to a low potential. Thus the bits to be read out are on the respective bit line pairs bla, blaq and blb, blbq and may be adopted by other parts of the data path, while the word lines wla, wlb are lowered back to a low potential to disconnect the memory cell again from the bit lines so that the bit lines may be prepared for the following access. A logical value 1 of a bit corresponds to a bit line pair value (1, 0), and a logical value 0 of a bit corresponds to a bit line pair value (0, 1).

Port Z is operated as pure write port. In the case of closed n-channel transfer transistors 614, the word line wlz is at a low potential level so that the transistors 614 block. First a bit to be written is transmitted from outside to the bit line pair blz, blzq, before the word line wlz is raised to a high potential level, node bit and bitq, respectively, thereby being conductively connected to the bit line pair blz and blzq, respectively, within the cell 615. A capacitive voltage divider existing immediately afterwards with generally very large bit line capacitances compared to capacitances within the cell, supported by an external write circuit (not shown) and a feedback within the cell, then lead to the value of the potential previously stored in the cell being overwritten with the one applied to the bit line pair blz, blzq. In this way, the word line wlz may be lowered back to a low potential to disconnect the memory cells again from the bit lines so that the latter may be prepared for the following access.

The cell depicted in FIG. 6 does not show which of the ports A, B, C, Z serve as read ports and which serve as write ports. This is determined by a temporal behavior impressed externally and/or by driving word lines wla, wlb, wlz and bit lines bla, blaq, blb, blbq, blz, blzq. Therefore both precharging and write and read drive circuits. (not shown in FIG. 6) are associated with port C described as write and read port in the periphery of the register file.

Normally, switching networks in ICs are implemented in a so-called single rail circuit technology. Here, each bit of an information to be processed is physically represented by exactly one electrical node. Single rail switching networks are susceptible to DPA attacks.

In order to prevent DPA attacks, ICs should ideally be designed so that they always provide the same current profile independent of the data to be processed. However this is not always the case for a single rail data path implementation. A charge integral associated with a temporal behavior of the states of a circuit is a function of the nodes and/or electrical capacitances which are electrically charge-reversed. Thus a single rail implementation is highly dependent on the temporal changes in the data to be processed.

For preventing the problem of variable charge integrals, the so-called dual rail logic is used for implementing the data paths. In contrast to the conventional single rail logic, in which each bit is physically represented within a data or signal path by exactly one electrical node k of a switching network or a logic device, in the case of an implementation with dual rail logic, each bit is represented by two nodes k and kq, wherein this bit has a valid logical value, then k corresponds to the true logical value b of this bit and kq corresponds to the negated value bn=|b. The register cell shown in FIG. 6 is realized in dual rail technology.

In dual rail technology, the desired invariance of the line integrals is achieved by a so-called precharge state, also referred to as precharge, being inserted between each two states with valid logical values (b, bn)=(1, 0) or (0, 1). In this precharge state, both k and kq are charged to the same electrical potential and thus adopt logically invalid values of (1, 1) or (0, 0). For a precharge state (1, 1), a state sequence could therefore be as follows:

(1, 1)→(0, 1)→(1, 1)→(1, 0)→(1, 1)→(1, 0)→(1, 1)→(0, 1)→ . . . ,

What applies for any such state sequence is that in any transition (1, 1)→(b, bn) exactly one node is charge-reversed from 1 to 0, and that for all (b, bn)→(1, 1) exactly one node is charge-reversed from 0 to 1, independent of the logically valid value b of the state bit in question.

This applies analogously to state sequences with the precharge state (0, 0).

The result, however, is that the charge integrals corresponding to these state sequences are independent of the sequence (b, bn) of the logically valid values, if the only thing taken account of is that the nodes k and kq have the same electrical capacitances. Thus the current profile of a data path such implemented does not depend on temporal variations of the data to be processed. It is thus resistant to DPA attacks. However, in real circuits the nodes k and kq normally have unequal capacitances.

Figure 7:
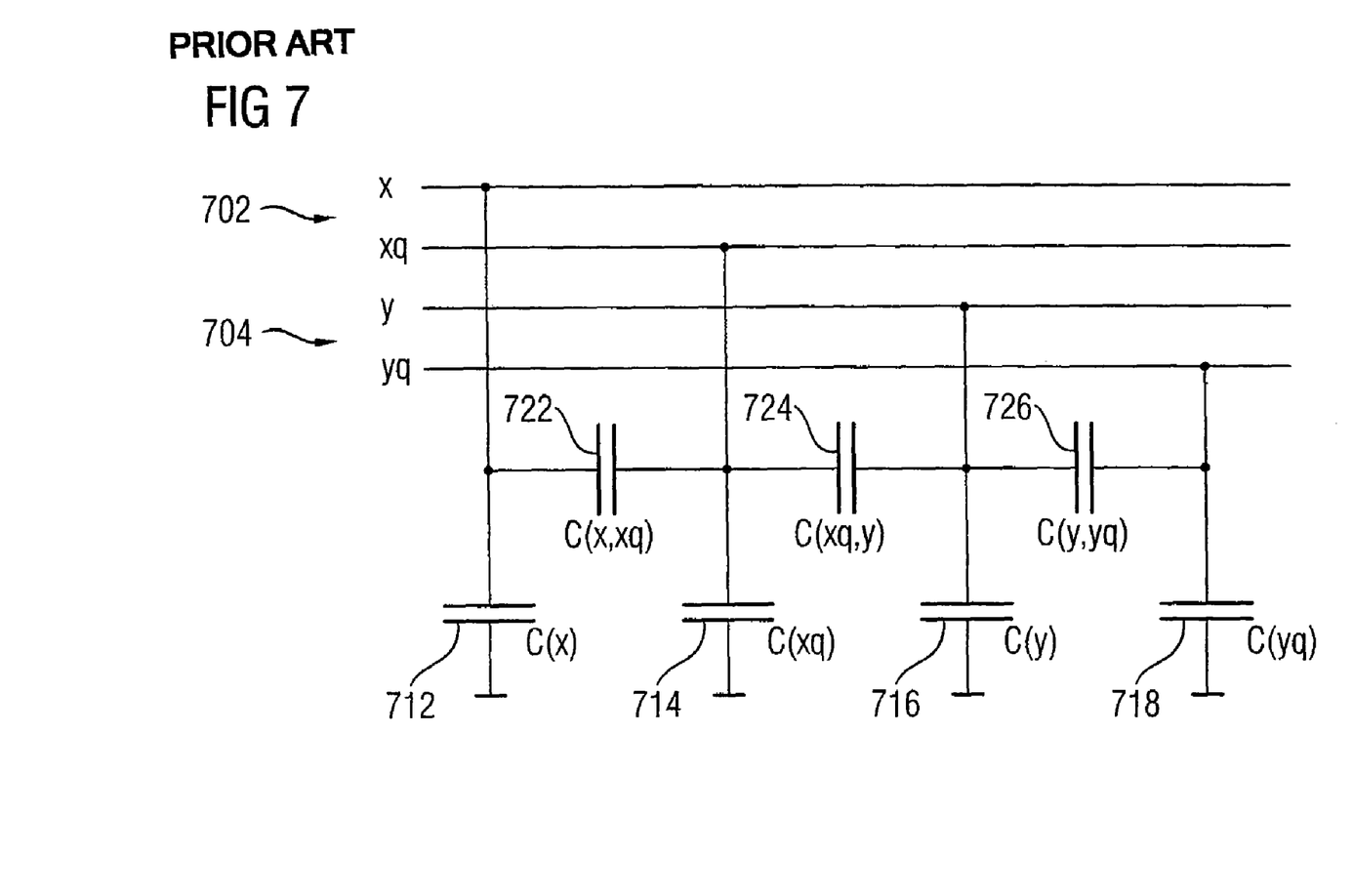
FIG. 7 is a schematic illustration of a bus system implemented in dual rail technology according to prior art.

FIG. 7 shows a data path consisting of two signal line pairs 702, 704. The data path is implemented in dual rail technology. That means that the line pair 702 comprises a signal line x and a signal line xq complementary to the signal line x. Likewise, the line pair 704 comprises a signal line y and a signal line yq complementary to the signal line y. The signal line pairs (x, xq) and (y, yq) have capacitances 712, 714, 716, 718 to a fixed potential denoted with C(*) and coupling capacitances 722, 724, 726 between the signal lines x, xq, y, yq denoted with C(*,#). In FIG. 7, only the coupling capacitances 722, 724, 726 between adjacent signal lines x, xq, y, yq are illustrated. The signal line x has the capacitance C(x) 712, the signal line xq has the capacitance C(xq) 714, the signal line y has the capacitance C(y) 716, and the signal line yq has the capacitance C(yq) 718. The signal lines x, xq are connected via the coupling capacitance C(x, xq) 722, the signal lines xq, y are connected via the coupling capacitance C(xq, y) 724, and the signal lines y, yq are connected via the coupling capacitance C(y, yq).

Depending on a precharge state and a subsequent logically valid state, some of the listed capacitances must be charge-reversed. In the following table, the sums of capacitances are given which are charged in the case of a transition from a precharge state (0, 0) to the logically valid states (0, 1) or (1, 0):

| precharge state | (x, xq) target state | (y, yq) target state | ΔC |
|---|---|---|---|
| (0, 0) | (0, 1) | (0, 1) | C(x, xq) + C(y, yq) + C(xq, y) + C(xq) + C(yq) |
| (0, 0) | (0, 1) | (1, 0) | C(x, xq) + C(y, yq) + C(xq) + C(y) |
| (0, 0) | (1, 0) | (0, 1) | C(x, xq) + C(y, yq) + C(x) + C(yq) |
| (0, 0) | (1, 0) | (1, 0) | C(x, xq) + C(y, yq) + C(xq, y) + C(x) + C(y) |

As can be seen from the above table, all coupling capacitances C(*,#)>0, that is coupling capacitances 722, 724, 726 differing from 0 and/or capacitances C(*)≠ C(*q), that is unequal capacitances 712, 714 of the first line pair 702 and unequal capacitances 716, 718 of the second line pair 704 yield data-depending capacitance sums ΔC and thus data-depending charge integrals.

Such data-dependent capacitance sums and charge integrals may still be used for DPA attacks. The dual rail technology thus does not offer an effective protection against DPA attacks.

A reduction of the problem of data-dependent effective coupling capacitances allowing a DPA analysis may be achieved by means of physically exchanging an arrangement of bit lines in certain intervals in the layout. This technology referred to as crossover of bit lines is primarily used in DRAMs. Data dependency of effective coupling capacitances may thus be reduced. However, data dependency of line capacitances with respect to a fixed potential remains. Therefore, a DPA analysis cannot be prevented by crossover. A further disadvantage of crossover are the considerable area requirements of this measure.

SUMMARY OF THE INVENTION

It is an object of the present invention to provide a device for generating a signal pair, a device for generating a recovered data signal, a device for carrying out a data path operation, and a device for storing a signal pair allowing a secure transmission and processing of data.

In accordance with a first aspect, the present invention provides a device for generating a signal pair from a data signal according to a switching rule depending on a switching signal value, having a first data signal input for receiving a first data signal; a first switching signal input for receiving a first switching signal; a first signal output for outputting a first signal; and a first complementary signal output for outputting a first complementary signal, wherein the first signal and the first complementary signal form a first signal pair; wherein the device for generating a signal pair is formed to output, according to the switching rule, the first data signal as the first signal and a complementary first data signal as the first complementary signal, when the first switching signal has a first value, and to output the first data signal as the first complementary signal and the complementary first data signal as the first signal, when the first switching signal has a second value.

In accordance with a second aspect, the present invention provides a device for generating a recovered data signal from a signal pair according to a complementary switching rule depending on a switching signal value, having a first signal input for receiving a first signal; a first complementary signal input for receiving a first complementary signal, wherein the first complementary signal is complementary to the first signal, and wherein the first signal and the first complementary signal form a first signal pair; a first switching signal input for receiving a first switching signal; and a first data signal output for outputting a first recovered data signal; wherein the device for generating a recovered signal is formed to output, according to the complementary switching rule, the first signal as the recovered data signal, when the first switching signal has a first value, and to output the first complementary signal as the first recovered data signal, when the first switching signal has a second value.

According to a third aspect, the present invention provides a device for performing a data path operation, having an above-mentioned device for generating a signal pair; an above-mentioned device for generating a recovered data signal; a unit for performing a data path operation, connected to the device for generating a signal pair via a signal pair on the input side, and to the device for generating a recovered data signal via a signal pair on the output side, and formed for receiving a data path control signal, wherein the data path control signal defines a data path operation to be performed on the first signal pair; a unit for adapting the switching signal, wherein the unit for adapting the switching signal is connected to the switching signal and the data path control signal, and is formed to provide a switching signal adapted to the data path operation to the device for generating a recovered data signal.

In accordance with a fourth aspect, the present invention provides a device for storing a signal pair, having an above-mentioned device for generating a signal pair; an above-mentioned device for generating a recovered data signal; a unit for storing a signal pair formed to store the first signal pair generated by the device for generating a signal pair; and a unit for storing a switching signal value formed to store a value of the switching signal and to provide it to the device for generating a recovered data signal, when the first signal pair is read out from the unit for storing a signal pair.

The invention is based on the finding that a data signal may be transmitted securely via a complementary signal line pair, when the data signal is transmitted depending on a switching signal value on the signal line of the signal line pair or the complementary signal line of the signal line pair. According to the invention, the function of signal line and complementary signal line is exchanged depending on the switching signal value.

The switching signal value is preferably independent of the data signal. According to a preferred embodiment, the switching signal has the first value or the second value, random-controlled and time-controlled.

The switching signal value is provided both to the device for generating a signal pair and the device for generating a recovered data signal. This allows to convert a data signal to a signal pair in the device for generating a signal pair, and later recover it in a device for generating a recovered data signal. Independent of whether the data signal was transmitted via the signal line or the complementary signal line according to the switching signal value, the true value of the data signal is recovered in the device for generating a recovered data signal.

A preferably random-controlled exchange of the roles of signal and complementary signal when transmitting data signals on a data path between the device for generating a signal pair and the device for generating a recovered data signal achieves that, for a variety of logically identical program flows of a complete system, an influence of capacitive dissymmetries of the signal line and the complementary signal line and of coupling capacitances between signal line pairs and their respective physically adjacent signal lines on a charge integral of the considered processing cycles is eliminated in the statistical average. Consequently, the relevance of capacitive dissymmetries and coupling capacitances of a data path or bus system for DPA attacks is eliminated.

The inventive approach is particularly suited for the use in integrated circuits whose data paths are implemented in dual rail technology and operate in precharge technology. In data processing systems comprising a plurality of ICs, the inventive approach may be used for the secure transmission of data between the ICs.

The inventive approach is implementable in digital logic, has low space requirements and thus allows a cost-effective and reliable method for preventing DPA attacks on security-relevant circuits. The present invention may also be advantageously employed in applications that are not security-relevant in order to avoid unfavorable effects of capacitive dissymmetries.

Furthermore, the present invention is used advantageously in connection with functional units of a microprocessor or other data processing circuits. The inventive approach allows a secure transmission of data signals to the functional units. In addition, an influence of wirings of the functional units usable for a DPA analysis is eliminated.

According to a preferred embodiment, the data to be transmitted are subjected to a data path operation (DPO). In order to take the performed data path operation into account in the recovery of the data signal in a device for generating a recovered data signal, the device for generating a recovered data signal comprises, in this embodiment, a device for adapting the complementary switching rule to the performed data path operation.

According to a further preferred embodiment, the inventive approach is used for an implementation of a memory. The memory is formed to store a signal pair provided by a device for generating a signal pair. In order to allow recovery of the data signal, the storing device comprises an additional storage means for storing the switching signal value.

BRIEF DESCRIPTION OF THE DRAWINGS

Preferred embodiments of the present invention are explained in more detail in the following with respect to the accompanying drawings, in which.

DESCRIPTION OF THE PREFERRED EMBODIMENTS

Figure 1:
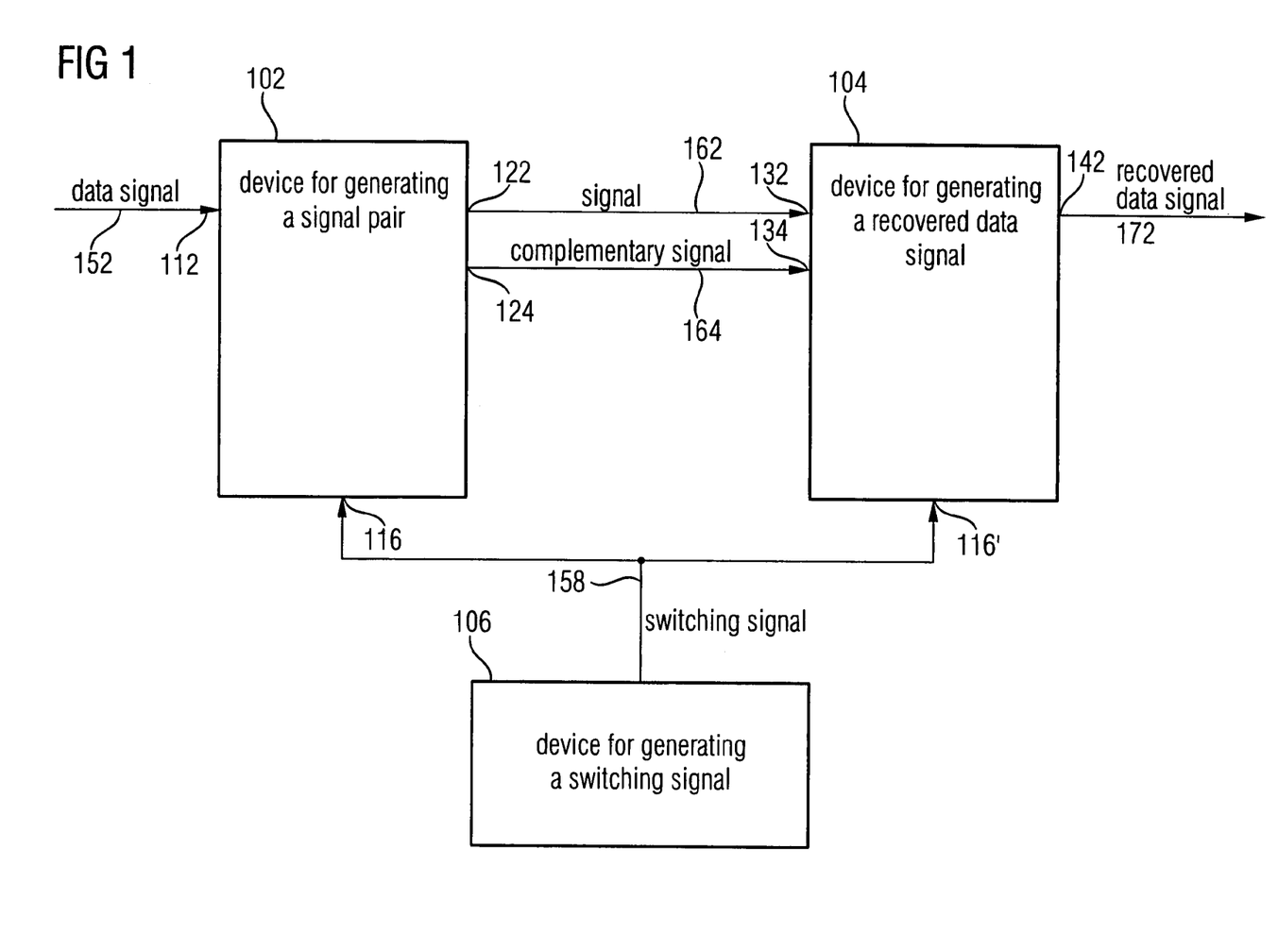
FIG. 1 is a schematic illustration of a transmission device according to the present invention.

FIG. 1 shows a schematic illustration of a transmission device comprising an inventive device 102 for generating a signal pair and an inventive device 104 for generating a recovered data signal. Furthermore, the bus system comprises means 106 for generating a switching signal. The device 102 for generating a signal pair comprises a data signal input 112 and a switching signal input 116. The device 102 for generating a signal pair further comprises a signal output 122 and a complementary signal output 124. The device 104 for generating a recovered data signal comprises a signal input 132 and a complementary signal input 134 as well as a switching signal input 116'. The device 104 for generating a recovered data signal further comprises a data signal output 142.

A data signal 152 is transmitted via the shown transmission device. The data signal 152 is connected to the device 102 for generating a signal pair via the data signal input 112. The device 102 for generating a signal pair is formed to form a signal pair consisting of a signal 16.2 and a complementary signal 164 from the data signal 152 according to a switching rule. If the signal 162 has the value logical "0", the complementary signal 164 has the value logical "1". If the signal 162 has the value logical "1", the complementary signal 164 has the value logical "0".

The signal 162 and the complementary signal 164 are provided by the device 102 for generating a signal pair at the signal output 122 and the complementary signal output 124, and are received by the device 104 for generating a recovered data signal at the signal input 132 and the complementary signal input 134. The device 104 for generating a recovered data signal is formed to form a recovered data signal 172 from the signal pair consisting of the signal 162 and the complementary signal 164 according to a complementary switching rule, and to output it at the data signal output 142.

Means 106 for generating a switching signal is formed to provide a switching signal 158 received by the device 102 for generating a signal pair at the switching signal input 116 and by the device 104 for generating a recovered data signal at the switching signal input 116'.

Preferably, the means 106 for generating a switching signal is formed to provide the switching signal 158 in a random-controlled way. The switching signal 158 random-controlled has a first value and a second value. In this embodiment, the switching signal 158 either has the value logical "0" or the value logical "1". The device 102 for generating a signal pair is formed to provide the data signal 152 as signal 162 or as complementary signal 164 according to the switching rule. If the switching signal 158 has the first value, the device 102 for generating a signal pair switches the data signal 152 through to the signal output 122. At the complementary signal output 124, the device 102 for generating a signal pair provides a signal 164 complementary to the signal 162. Consequently, the data signal 152 is output either at the signal output 122 or the complementary signal output 124 depending on the switching signal 158. If the switching signal value 158 is generated in a random-controlled way, the output of the data signal 152 as signal 162 or as complementary signal 164 is also performed in a random-controlled way and is thus not predictable.

Corresponding to the capacitances explained in FIG. 7, the lines of the signal 162 and the complementary signal 164 shown in FIG. 1, as well as respectively adjacent signals and complementary signals (not shown) also have capacitances with respect to a fixed potential as well as coupling capacitances. The mentioned capacitances are not shown in FIG. 1. According to the present invention, the total capacitance to be charge-reversed in a switching process does not only depend on the capacitance values and a performed data signal switching process, but also on the value of the switching signal 158. This results from the fact that, controlled by the switching signal 158, the signal 162 is exchanged with the complementary signal 164. If the generation of the switching signal 158 is performed in a random-controlled way, an association of a total capacitance with a data signal switching process is no longer possible. A DPA attack on the lines of the signal 162 and the complementary signal 164 is thus not feasible.

After transmitting the signal 162 and the complementary signal 164 via the data path, there is a back-switching of the signals in the device 104 for generating a recovered data signal. As the device 104 for generating a recovered data signal is also connected to the switching signal 158, back-switching inverse to the switching carried out in the device 102 for generating a signal pair is possible. Corresponding to the switching in the device 102 for generating a signal pair described above, the device 104 for generating a recovered data signal is formed to output the signal 162 as recovered data signal 172 in response to a first value of the switching signal 158.

The recovered data signal 172 thus corresponds to the data signal 152. According to the present invention, the device 102 for generating a signal pair and the device 104 for generating a recovered data signal allow to transmit the data signal 152 via a data path without a DPA attack on the transmission route of the data path being possible.

According to the embodiment shown in FIG. 1, the data signals 152, 172 are implemented in single-rail technology, and the signals 162, 164 are implemented in dual rail technology, preferably with precharge technology.

According to a further embodiment, the data signals are also implemented in dual rail technology.

The transmission device shown in FIG. 1 is part of a data bus. Unlike the shown embodiment, the data bus may comprise any number of data signals. With a variety of data signals, it is advantageous to combine individual data signals into groups and to provide an own switching signal value for each group. Thus, if the data bus has two data signal groups, for example, preferably two switching signal values are provided in the form of two independent, time-dependent random bits.

Figure 2:
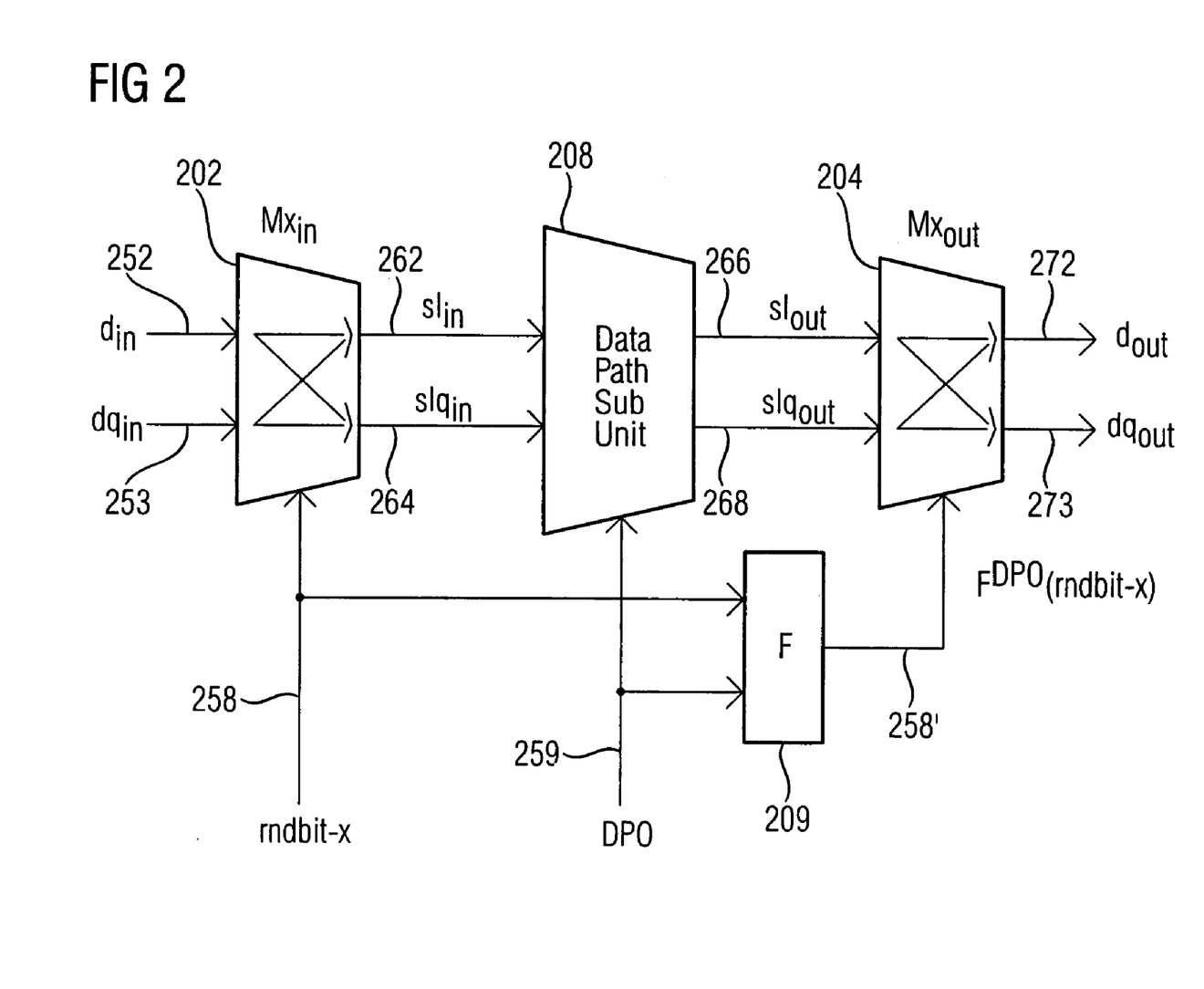
FIG. 2 is a schematic illustration of a device for performing a data path operation according to a further preferred embodiment of the present invention.

FIG. 2 shows a device for performing a data path operation according to a further preferred embodiment. The device for performing a data path operation comprises a device for generating a signal pair 202 in the form of a multiplexer circuit $Mx_{in}$, a device 204 for generating a recovered data signal in the form of a multiplexer circuit $Mx_{out}$, as well as means 208 for performing a data path operation and means 209 for adapting the switching signal. In this embodiment, the means 208 for performing a data path operation is a shift unit. Instead of a shift unit performing a shift operation, the means 208 for performing a data path operation may also represent any other functional unit useable in a data path.

The multiplexer circuit 202 is formed for receiving a data signal 252 as well as a data signal 253 complementary to the data signal 262. The multiplexer circuit 202 is further formed for receiving a switching signal 258 and for outputting a signal 262 as well as a complementary signal 264. Corresponding to the device for generating a signal pair described in FIG. 1, the multiplexer circuit 202 is formed to output the data signal 252 either as signal 262 or as complementary signal 264 in response to a value of the switching signal 258. Depending on a value of the switching signal 258, the multiplexer circuit 202 thus exchanges the roles of the signals 262, 264.

The means 208 for performing a data path operation is formed for receiving the signal 262 and the complementary signal 264. Depending on a data path control signal 259, the means 208 for performing a data path operation is formed to perform a data path operation and to provide an output signal 266 and a complementary output signal 268 corresponding to this operation.

The multiplexer 204 is formed for receiving the output signal 266 and the complementary output signal 268, as well as for outputting a recovered data signal 272 and a recovered complementary data signal 273. For this, the multiplexer 204 receives a switching signal 258'. The switching signal 258' is provided by the means 209 for adapting the switching signal. The device 209 for adapting the switching signal is formed to adapt the switching signal 258' corresponding to the data path operation performed in the means 208 for performing a data path operation. For this, the means 209 for adapting the switching signal receives both the switching signal 258 and the data path control signal 259 and generates the switching signal 258' therefrom.

According to the embodiment shown in FIG. 2, the data signal pair 252, 253 represents a data signal pair of a data signal pair bus of the width w. The data signal 252, hereinafter referred to as $d_{in}$, stands for a plurality n, n=w−1, w−2, . . . 0, of data signals $d_{in}<n>$, and the complementary data signal 253, hereinafter referred to as $dq_{in}$, stands for a plurality n of complementary data signals $dq_{in}<n>$. Likewise, the signal pair 262, 264, hereinafter referred to as ($sl_{in}$, $slq_{in}$), stands for a plurality n of signal pairs ($sl_{in}<n>$, $slq_{in}<n>$), and the output signal pair 266, 268, hereinafter referred to as ($sl_{out}$, $slq_{out}$), stands for a plurality n of output signal pairs ($sl_{out}<n>$, $slq_{out}<n>$), and the recovered signal pair 272, 273, hereinafter referred to as ($d_{out}$, $dq_{out}$), stands for a plurality n of recovered output signal pairs ($d_{out}<n>$, $dq_{out}<n>$).

Corresponding to the embodiment described in FIG. 1, the signal line pairs ($sl_{in}$, $slq_{in}$), ($sl_{out}$, $slq_{out}$) are parts of a data path which, in this embodiment, additionally comprises means 208 for performing a data path operation. According to this embodiment, the means 208 for performing a data path operation is a shift unit in the form of a shifter. Wiring (not shown) from the means 208 for performing a data path operation to the signal line pairs ($sl_{in}$, $slq_{in}$), ($sl_{out}$, $slq_{out}$) and/or the signal line pairs ($sl_{in}$, $slq_{in}$), ($sl_{out}$, $slq_{out}$) themselves comprise significant coupling capacitances as well as capacitive dissymmetries between a signal line sl and its complementary signal line slq. In the following, the designation sl stands both for the signal line $sl_{in}$ and for the output signal line $sl_{out}$, and the designation slq stands for the complementary signal line $slq_{in}$ and the complementary output signal line $slq_{out}$. The mentioned capacitances are not shown in FIG. 2. As described with respect to FIG. 7, the capacitances between the signals sl and slq allow a DPA analysis of the device for performing a data path operation. According to the invention, such a DPA analysis is prevented by a random-controlled conditional permutation of the meaning of the signals sl and slq of a single physical signal line pair (sl, slq). This occurs such and/or provided that a logical arithmetic function performed in a part of the data path remains unchanged by these permutations. For this, the signal line pairs (sl<n>, slq<n>), wherein n=w−1, w−2, . . . , 0 and w is a word width of the data path, are assumed to be physically, i.e. in layout, arranged corresponding to their significance n, so that the next neighbors of signal line pairs with even n=2j are those with odd n=2j+1 as well as n=2j−1, and vice versa, without limitation of generality. An exception are the most significant and/or least significant signal line pairs with n=w−1 and/or n=0.

In the following, the embodiment of the means 208 for performing a data path operation in the form of a shift unit is discussed in more detail. When processing data $d_{in}<w-1:0>$ at the signal line pairs ($sl_{in}<n>$, $slq_{in}<n>$) on the input side of the shift unit 208, data bits of even significance $d_{in}<2j>$ and/or of odd significance $d_{in}<2j+1>$ are treated differently. Via the multiplexer circuit 202 $Mx_{in}$ preceding the signal lines ($sl_{in}<n>$, $slq_{in}<n>$), the signal line pairs $sl_{in}$, $slq_{in}$ are driven, in this embodiment, depending on a time $t_s$ of a processing procedure of the data signals $d_{in}$, by random bits rndbit−evn($t_s$) and rndbit−odd($t_s$) suitably generated and/or present on the switching signal 258, as follows:

$(sl_{in}<n>, slq_{in}<n>) <= (d_{in}<n>, dq_{in}<n>))$ for rndbit−x $(t_s)$,=0

$(sl_{in}<n>, slq_{in}<n>) <= (\text{not}(d_{in}<n>), \text{not }(dq_{in}<n>))$ for rndbit−x($t_s$),=1 wherein x=evn for n=2j and x=odd for n=2j+1.

In this embodiment, the switching signal 258 thus has the value rndbit−x, which has either the logical value "0" or the logical value "1". In this embodiment, the switching signal comprises a random-controlled component rndbit and a time-controlled component x($t_s$). The random value rndbit is preferably provided by a random number generator (not shown). The time-controlled component is controlled via a time signal (not shown). The time signal may be a clock signal with-which means for generating the switching signal is connected. Alternatively, a time controller may depend on a number of received data signals. Analogous to the multiplexer circuit 202, the recovered data signals $d_{out}$, $dq_{out}$ are recovered from the output signal $sl_{out}$, $slq_{out}$ via the multiplexer circuit 204 $Mx_{out}$. For this, the conditional permutations given above are reversed. This is done by means of a certain function $F^{DPO}_n$ {rndbit−evn($t_s$), rndbit−odd($t_s$)} of the value of the switching signal 258 used for the permutation on the input side in the multiplexer circuit 202, so that, at the output of the multiplexer circuit 204, there will always be the true logical value $d_{out}<w-1:0>$ resulting from $d_{in<w-1:0>}$. This means:

$(d_{out}<n>, dq_{out}<n>) <= (sl_{out}<n>, slq_{out}<n>)$ for $F^{DPO}_n$, =0, $(d_{out}<n>, dq_{out}<n>) <= (\text{not } (sl_{out}<n>), \text{not} slq_{out}<n>))$ for $F^{DPO}_n$,=1

Here, a shape of $F^{DPO}_n$ depends on the data path operations performed in the part in question of the data path, the means 208 for performing a data path operation. In the embodiment, the data path operation is a shift operation with a variable number sft of bit positions that input data of the shift unit 208 may be shifted. The value sft is provided to the shift unit via the data path control signal 259. Thus the following applies with DPO=sft:

$F^{sft}_{2j}$=rndbit-evn($t_s$) for even values of sft
$F^{sft}_{2j}$=rndbit-odd($t_s$) for odd values of sft, and
$F^{sft}_{2j+1}$=rndbit-odd ($t_s$) for even values of sft and
$F^{sft}_{2j+1}$=rndbit-evn ($t_s$) for odd values of sft The function $F^{DPO}$ is generated in the means 209 for adapting the switching signal and provided to the multiplexer circuit 204 via the switching signal 258'.

The exchange, described with respect to FIG. 2, of the roles of sl and slq depending on random bits when processing data words $d_{in}$, $dq_{in}$ achieves that, for a variety of logically identical program flows of a complete system, the influence of capacitive dissymmetries of the signal lines sl, slq as well as the coupling capacitances between the signal lines sl and slq and their respective physically adjacent lines on the charge integral of the considered processing cycles is eliminated in the statistical average. Consequently, the relevance of this capacitive dissymmetry and coupling capacitances for DPA attacks is eliminated.

Figure 3:
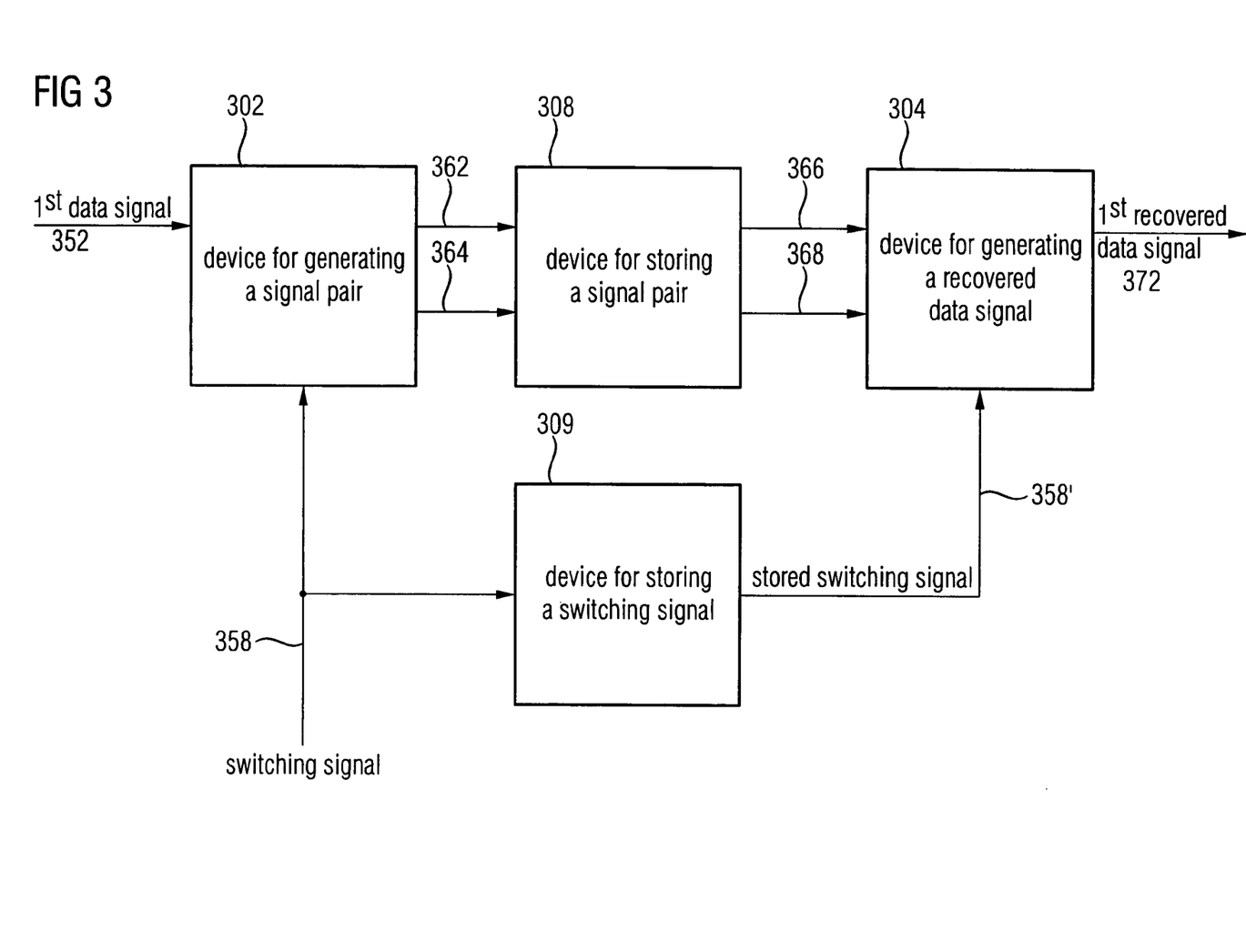
FIG. 3 is a schematic illustration of a device for storing a signal pair according to a further preferred embodiment of the present invention.

FIG. 3 shows a schematic illustration of a device for storing a signal pair according to a preferred embodiment of the present invention. The device for storing a signal pair comprises a device 302 for generating a signal pair, a device 304 for generating a recovered data signal, as well as a device 308 for storing a signal pair, and a device 309 for storing a switching signal value. Corresponding to the embodiment described in FIG. 1, the device 302 for generating a signal pair is formed to output a first data signal 352 as first signal 362 and/or as first complementary signal 364 in response to a value of a switching signal 358. The first signal pair 362, 364 is stored in the device 308 for storing a signal pair, and is output by the device 308 for storing a signal pair as first stored signal 366 and first stored complementary signal 368 in a read-out process. Corresponding to the embodiment in FIG. 1, the device 304 for generating a recovered data signal is, in turn, formed to output either the first stored signal 366 or the first stored complementary signal 368 as first recovered data signal 372. For this, the device 304 for generating a recovered data signal is required to obtain the value of the switching signal 358 with which the first data signal 352 was switched in the device 302 for generating a signal pair. For this, the value of the switching signal 358 is stored in the device 309 for storing a switching signal, and is output as stored switching signal 358' to the device for generating a recovered data signal in parallel to the output of the first stored signal pair 366, 368.

The device for storing a signal pair shown in FIG. 3 thus allows to store a first data signal 352 in a storage means and to read it out again. The input signals 362, 364 and the output signals 366, 368 of means 308 for storing a signal pair are again protected against a DPA attack by the inventive device 302 for generating a signal pair.

Figure 4:
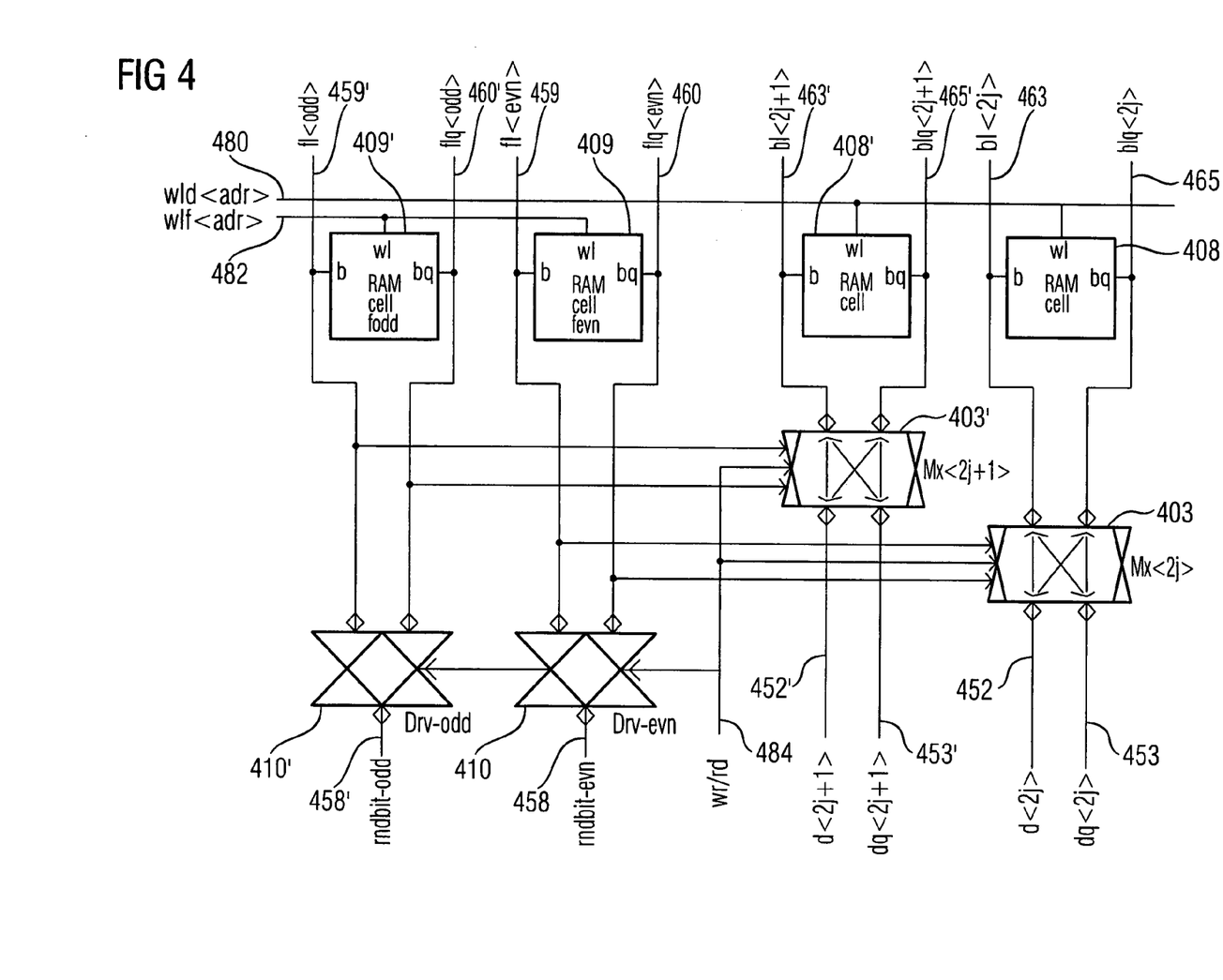
FIG. 4 is a schematic illustration of means for storing a signal pair according to a further embodiment of the present invention.

FIG. 4 shows a preferred embodiment of a device for storing a signal pair in the form of a so-called single port memory, as used for RAMs or cache memories. For reasons of clarity, only two memory cells are shown in FIG. 4, which, however, are representative for a plurality of memory cells. Corresponding to the embodiment shown in FIG. 3, the single port memory comprises a device for generating a signal pair and a device for generating a recovered data signal. Both devices are arranged in a multiplexer circuit 403. Means for storing a signal pair 408 is implemented in the form of a RAM cell, just like means 409 for storing a switching signal. Via a bidirectional drive circuit 410, a switching signal 458 is provided to the means 409 for storing a switching signal. The switching signal 458 is converted to a switching signal 459 to be stored and a switching signal 460 to be stored complementary thereto. The signals 459, 460 are also connected to the multiplexer circuit 403. In this embodiment, the data signals to be stored are provided to the multiplexer circuit 403 in the form of a data signal 452 and a data signal 453 complementary thereto. Corresponding to the switching signals 459, 460, the data signals 452, 453 are switched in response to a read/write signal 484 according to the present invention and are provided as signals 463, 465 to be stored to the RAM cell 408 corresponding to a value of the switching signals 459, 460. In this embodiment, the signal lines 463, 465 serve both for writing to the RAM cell 408 and for reading out the information stored in the RAM cell. The recovered data signals are also output on the data signal lines 452, 453 by the multiplexer circuit 403. The multiplexer circuit 403 is thus designed bidirectional in this embodiment. A second memory cell and the associated controllers are designated with the same reference numbers as those of the first memory cell 408, but marked by a "'". The second memory cell 408' is driven by a switching signal 458' corresponding to the switching signal 458 of the first memory cell 408, but independent.

The multiplexer circuits 403, 403' again allow protection of the signal lines 463, 465, 463', 465' against DPA attacks. The signal line pairs (463, 465), (463', 465') are hereinafter referred to as (bl, blq) and are representative for a plurality of signal line pairs. By a random-controlled permutation of the significance of the bit line bl and its complementary bit line blq of a single physical bit line pair in the multiplexer circuit 403, 403', the lines bl, blq are protected against a DPA analysis. For this, the bit line pairs (bl<n>,blq<n>) and/or the associated data words (d<n>,dq<n>) corresponding to the data signals (452, 453), (452', 453') are assumed to be arranged physically corresponding to their significances, wherein n=w−1, w−2, ... , 0 and w represents the word width of the data words (d<n>, dq<n>), without limitation of generality. In layout, the next neighbors of bit line pairs with even n=2j are thus ones with odd n=2j+1 and n=2j−1, and vice versa. Exceptions are again the most significant and/or least significant bit line pairs with n=w−1 and/or n=0.

When writing and reading data words d<w−1:0> under an address adr to the corresponding bit line pairs (bl<n>, blq<n>), data bits of even and/or odd significance d<2j> and d<2j+1>, respectively, are now treated differently.

Via the multiplexer circuits designated Mx<n> within the drive circuit (403, 403') associated with a write/read input of a RAM cell for the considered bit line pair, depending on random bits rndbit-evn ($t_s$) and rndbit-odd ($t_s$) suitably generated and/or present at a time $t_s$ of a write process to a memory cell and corresponding to the values of the switching signal 458, 458', the bit line pairs (bl<n>, blq<n>) and, consequently, the memory cells corresponding to the address adr are written to as follows:

(bl<n>, blq<n>)<=(d<n>, not (d<n> for rndbit-x($t_s$)
=0;

(bl<n>, blq<n>)<=>not (d<n>), d<n>) for rndbit-x
($t_s$)=1;

wherein x=evn for n=2j and x=odd for n=2j+1.

In addition, the random bits rndbit-evn($t_s$) and rndbit-odd($t_s$) are written to two additional memory cells 409, 409' associated with the address adr and designated fevn and fodd, during a write process.

When reading out a data word from a memory cell 408, 408' associated with the address adr, it drives either ($d_{adr}$<n>, not ($d_{adr}$<n>)) or (not ($d_{adr}$<n>), $d_{adr}$<n>) to the bit line pair (bl<n>, blq<n>), which is connected to drivers for the data outputs 452, 453 and 452', 453' via the multiplexer circuits 403, 403', which may be referred to as conditional inverter circuits. Depending on the values of $fevn_{adr}$ and $fodd_{adr}$ read out simultaneously, the values at the bit line pair (bl<n>, blq<n>) are either inverted for $fevn_{adr}$/$fodd_{adr}$=1 or left unchanged for $fevn_{adr}$/$fodd_{adr}$=0, so that, at the output of the multiplexer 403, 403', there will always be the true logical value $d_{adr}$<w−1:0>.

For the described embodiment, it is sufficient to use only one word line wl<adr> instead of the separate word lines 480, 482 or wlf<adr>, wld<adr> given in FIG. 3 for flags and/or data. Separate word lines 480, 482 are required for the embodiment explained below.

This embodiment results from the requirement that it should be possible to overwrite only a part, such as a byte or part of a data word consisting of several bytes, to the address adr, without affecting an integrity of the remaining parts of the data word in question. In this case, random bits from outside the memory may thus not be written on the values of the switching signal 458, 458' associated with the address adr, i.e. $fevn_{adr}$/$fodd_{adr}$, as this would mean the loss of the remaining parts of the data word in question. Instead, $fevn_{adr}$ and $fodd_{adr}$ are first read out via an own word line wlf<adr>482 during a first part of a write access to the part in question of the data word, and the values thus obtained of random bits stored sometime before control the multiplexer circuits 403, 403' within the drive circuits associated with the write port for the bit line pairs corresponding to the part in question of the data word, so that these drive circuits, in a second part of the write access to the part in question of the data word, now write the logical values (d<n>, not (d<n>)) or their inverses (not (d<n>), d<n>) to the respective bit line pairs, corresponding to the values of $fevn_{adr}$/$fodd_{adr}$. In a temporally offset way, the word line 480 wld<adr> of the whole data word to the address adr is activated, so that the part of the data word selected via the active drive circuits of the write port is overwritten, while the remaining parts of the data word corresponding to the inactive drive circuits of the write port are read out from the corresponding memory cells 408 to the bit line pairs 463, 465 connected thereto.

Such an exchange, depending on random bits, of the roles of bl and blq when writing and reading data words to (bl<w−1:0>, blq<w−1:0>) achieves that, for a variety of logically identical program flows of the complete system, an influence of capacitive dissymmetries of bl and blq as well as the coupling capacitances between bl and/or blq and their respective physically adjacent lines on the charge integral of the considered memory accesses is eliminated in the statistical average and, consequently, the relevance of these capacitive dissymmetries and coupling capacitances for DPA attacks is eliminated.

Figure 5:
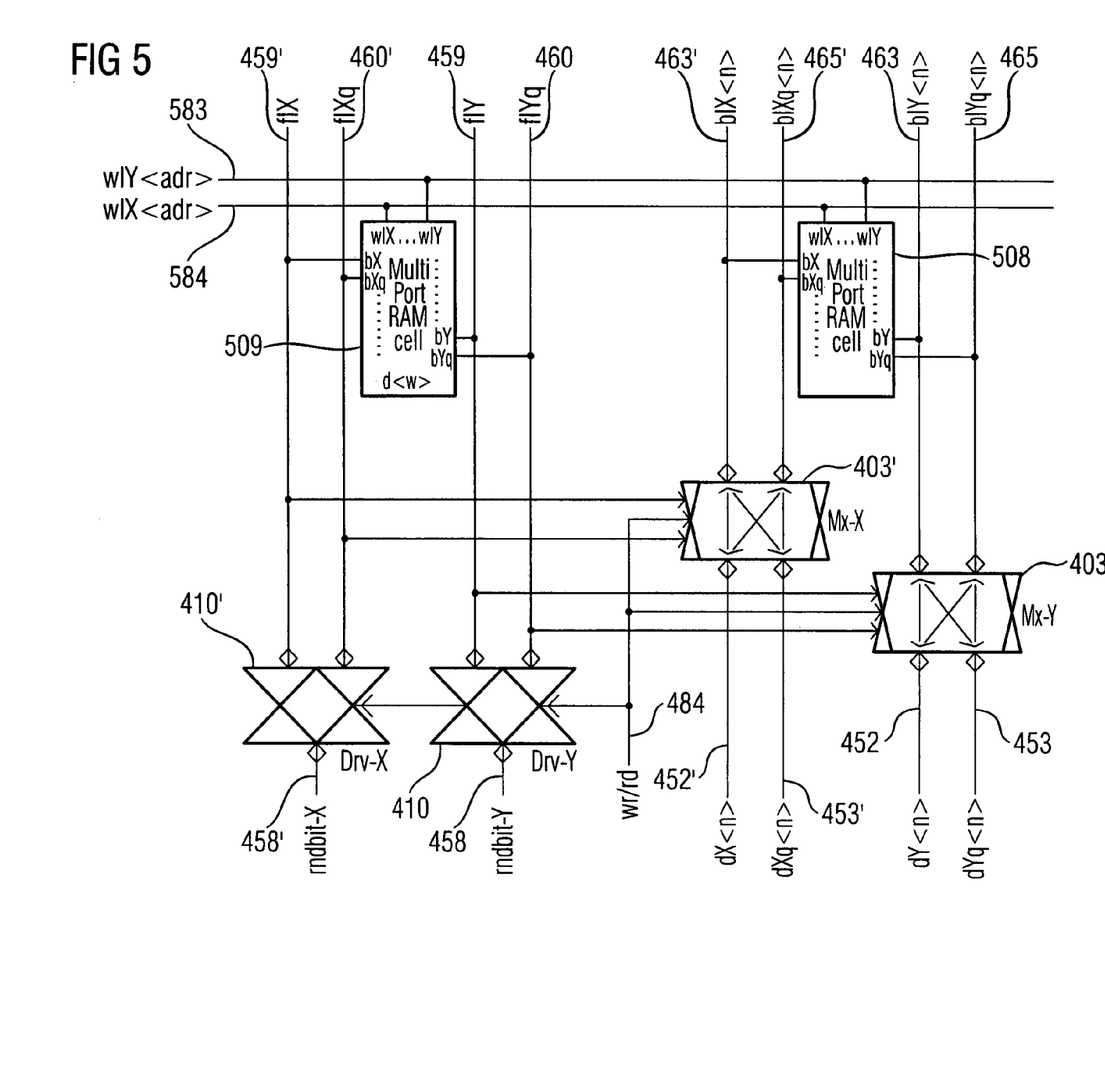
FIG. 5 is a schematic illustration of means for storing a signal pair according to a further embodiment of the present invention.

FIG. 5 shows a further embodiment of a device for storing a signal pair in the form of so-called multi-port memory cells, as used for RAMs or register files. By a random-controlled permutation of the significance of a bit line blX and its complementary bit line blXq of a single physical bit line pair (blX, blXq) corresponding to a port X of a memory cell, the shown multi-port memory cell is protected against DPA attacks.

Elements shown in FIG. 5, which have already been discussed in FIG. 4, are designated with the same reference numbers and will not be described further in the following. Instead of the RAM cells 408, 408', 409, 409' shown in FIG. 4, the embodiment shown in FIG. 5 comprises multi RAM cells 508, 509.

When writing a data word with a bit width w under an address adr to a multi memory cell 508 via one of its write inputs, according to the invention, either the logical value of the data word $$d<w-1:0> = [(d<w-1>, \text{not } (d<w-1>)), (d<w-2>, \text{not } (d<w-2>)), \ldots (d<0>, \text{not } (d<0>))]$$

or the bitwise complementary value $$\text{not } (d<w-1:0>) = [(\text{not} <d<w-1>), d<w-1>), (\text{not } (d<w-2>), d<w-2>), \ldots (\text{not } (d<0>), d<0>)]$$

are written to the corresponding multi-port memory cell 508 via a physical bit line pair group (463', 465') or (blX<w−1:0>, blXq<w−1:0>). This is done by suitable multiplexer circuits 403' designated Mx-X within a drive circuit associated with the write port for the considered bit line pair 463', 465'. Here, a random bit rndbit ($t_s$) on the switching signal 458' suitably generated and/or present at the time $t_s$ of the write process decides whether dX<w−1:0> or not (dX<w−1:0>) is stored. In this embodiment, the value dX<w−1:0> is driven via the multiplexer 403' with rndbit ($t_s$)=0, and stored in the multi memory cell 508, and the value not(dX<w−1:0>) with rndbit($t_s$)=1.

The value of the switching signal 458' rndbit($t_s$) is written to a further multi memory cell 509 associated with the address adr and designated d<w> during the write process.

When reading out a data word under the address adr via one of the read outputs of the multi memory cells 508, the read outputs first drive either $d_{adr}$<w−1:0>, not ($d_{adr}$<w−1:0>) or (not ($d_{adr}$<w−1:0>), $d_{adr}$<w−1:0>) to the bit line pair group (463', 465') or (blX<w−1:0>, blXq<w−1:0>), which is connected to the data signal lines 452', 453' via a multiplexer circuit 403'. Depending on the simultaneously read out value of $d_{adr}$<w>, the value at the signal lines 463', 465' (blX<w−1:0>, blXq<w−1:0>) is either inverted (for $d_{adr}$<w>=1) or left unchanged (for $d_{adr}$<w>=0), so that, on the data signal lines 452', 453', there will always be the true logical value dadr<W−1:0>, which may then be further processed by a receiver circuit.

This exchange, depending on random bits, of the roles of blX and blXq when writing and reading data words on (blX<w−1:0>, blXq<w−1:0>) achieves that, for a variety of logically identical program flows of the complete system, the influence of capacitive dissymmetries of blX and blXq as well as the coupling capacitances between blX and/or blXq and their respective physically adjacent lines on the charge integral of the considered memory accesses is eliminated in the statistical average. Consequently, the relevance of these capacitive dissymmetries and coupling capacitances for DPA attacks is eliminated.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A transmission device for generating a signal pair from a data signal according to a switching rule depending on a switching signal value, comprising:
 a first data signal input for receiving a first data signal;
 a first switching signal input for receiving a first switching signal;

a first signal output for outputting a first signal;

a first complementary signal output for outputting a first complementary signal, wherein the first signal and the first complementary signal form a first signal pair; and a unit for precharging the first signal pair to a defined precharge state, wherein the device for generating a signal pair is formed to output, according to the switching rule, the first data signal as the first signal and a complementary first data signal as the first complementary signal, when the first switching signal has a first value, and to output the first data signal as the first complementary signal and the complementary first data signal as the first signal, when the first switching signal has a second value.

2. The transmission device for generating a signal pair of claim 1, further comprising:

a second data signal input for receiving a second data signal;

a second switching signal input for receiving a second switching signal;

a second signal output for outputting a second signal; and a second complementary signal output for outputting a second complementary signal;

wherein the device for generating a signal pair is further formed to output the second data signal as the second signal and a complementary second data signal as the second complementary signal, when the second switching signal has the first value, and to output the second data signal as the second complementary signal and the complementary second data signal as the second signal, when the second switching signal has the second value.

3. The transmission device of claim 1, wherein the first signal pair is implemented in dual rail technology.

4. A transmission device for generating a recovered data signal from a signal pair according to a complementary switching rule depending on a switching signal value, comprising:

a first signal input for receiving a first signal;

a first complementary signal input for receiving a first complementary signal, wherein the first complementary signal is complementary to the first signal, and wherein the first signal and the first complementary signal form a first signal pair;

a first switching signal input for receiving a first switching signal; and a first data signal output for outputting a first recovered data signal;

wherein the device for generating a recovered data signal is formed to output, according to the complementary switching rule, the first signal as the first recovered data signal, when the first switching signal has a first value, and to output the first complementary signal as the first recovered data signal, when the first switching signal has a second value.

5. A transmission device for generating a signal pair from a data signal according to a switching rule depending on a switching signal value, comprising:

a first data signal input for receiving a first data signal;

a first switching signal input for receiving a first switching signal;

a first signal output for outputting a first signal;

a first complementary signal output for outputting a first complementary signal, wherein the first signal and the first complementary signal form a first signal pair; and a unit for generating a switching signal formed to generate the first switching signal, wherein the device for generating a signal pair is formed to output, according to the switching rule, the first data signal as the first signal and a complementary first data signal as the first complementary signal, when the first switching signal has a first value, and to output the first data signal as the first complementary signal and the complementary first data signal as the first signal, when the first switching signal has a second value, and.

6. The transmission device of claim 5, wherein the unit for generating a switching signal comprises a unit for setting the first switching signal to the first value or the second value in a random-controlled way.

7. The transmission device of claim 5, wherein the unit for generating a switching signal comprises a time signal input for setting the first switching signal to the first value or the second value in a time-controlled way.

8. The transmission device of claim 5, wherein the unit for generating a switching signal is formed to generate a second switching signal.

9. A transmission device for performing a data path operation, comprising:

a device for generating a signal pair from a data signal according to a switching rule depending on a switching signal value, comprising a first data signal input for receiving a first data signal; a first switching signal input for receiving a first switching signal; a first signal output for outputting a first signal; and a first complementary signal output for outputting a first complementary signal, wherein the first signal and the first complementary signal form a first signal pair; wherein the device for generating a signal pair is formed to output, according to the switching rule, the first data signal as the first signal and a complementary first data signal as the first complementary signal, when the first switching signal has a first value, and to output the first data signal as the first complementary signal and the complementary first data signal as the first signal, when the first switching signal has a second value;

a device for generating a recovered data signal from the first signal pair according to a complementary switching rule depending on the switching signal value, comprising a first signal input for receiving the first signal; a first complementary signal input for receiving the first complementary signal, wherein the first complementary signal is complementary to the first signal; a first switching signal input for receiving the first switching signal; and a first data signal output for outputting a first recovered data signal; wherein the device for generating a recovered data signal is formed to output, according to the complementary switching rule, the first signal as the first recovered data signal, when the first switching signal has the first value, and to output the first complementary signal as the first recovered data signal, when the first switching signal has the second value;

a unit for performing a data path operation, connected to the device for generating a signal pair via a signal pair on the input side, and to the device for generating a recovered data signal via a signal pair on the output side, and formed for receiving a data path control signal, wherein the data path control signal defines a data path operation to be performed on the first signal pair;

a unit for adapting the switching signal, wherein the unit for adapting the switching signal is connected to the switching signal and the data path control signal, and is formed to provide a switching signal adapted to the data path operation to the device for generating a recovered data signal.

10. The transmission device for performing a data path operation of claim 9, wherein the unit for performing a data path operation is a shift unit and the data path control signal provides a shift value, and wherein the shift unit is connected to the device for generating a signal pair via a plurality of signal pairs on the input side, and associates, corresponding to the shift value, the plurality of signal pairs on the input side with a plurality of signal pairs on the output side, via which the unit for performing a data path operation is connected to the device for generating a recovered data signal.

11. A transmission device for storing a signal pair, comprising:

a device for generating a signal pair from a data signal according to a switching rule depending on a switching signal value, comprising a first data signal input for receiving a first data signal; a first switching signal input for receiving a first switching signal; a first signal output for outputting a first signal; and a first complementary signal output for outputting a first complementary signal, wherein the first signal and the first complementary signal form a first signal pair; wherein the device for generating a signal pair is formed to output, according to the switching rule, the first data signal as the first signal and a complementary first data signal as the first complementary signal, when the first switching signal has a first value, and to output the first data signal as the first complementary signal and the complementary first data signal as the first signal, when the first switching signal has a second value;

a device for generating a recovered data signal from the first signal pair according to a complementary switching rule depending on the switching signal value, comprising a first signal input for receiving the first signal; a first complementary signal input fur receiving the first complementary signal, wherein the first complementary signal is complementary to the first signal; a first switching signal input for receiving a first switching signal; and a first data signal output for outputting a first recovered data signal; wherein the device for generating a recovered data signal is formed to output, according to the complementary switching rule, the first signal as the first recovered data signal, when the first switching signal has the first value, and to output the first complementary signal as the recovered data signal, when the first switching signal has the second value;

a unit for storing a signal pair formed to store the first signal pair generated by the device for generating a signal pair; and a unit for storing a switching signal value formed to store a value of the switching signal and to provide it to the device for generating a recovered data signal, when the first signal pair is read out from the unit for storing a signal pair.

12. The transmission device for storing a signal pair of claim 11, wherein the unit for storing a signal pair is a single port memory cell.

13. The transmission device for storing a signal pair of claim 12, wherein the unit for storing a signal pair is a multi-port memory cell.

\* \* \* \* \*

UNITED STATES PATENT AND TRADEMARK OFFICE
CERTIFICATE OF CORRECTION

PATENT NO. : 7,161,869 B2 Page 1 of 1
APPLICATION NO. : 11/022278
DATED : January 9, 2007
INVENTOR(S) : Thomas Kuenemund et al.

It is certified that error appears in the above-identified patent and that said Letters Patent is hereby corrected as shown below:

At column 7, line 33, "16.2" should read --162--

At Claim 5, column 16, line 11, "value, and." should read --value.--

Signed and Sealed this

Twenty-seventh Day of March, 2007

JON W. DUDAS
*Director of the United States Patent and Trademark Office*